United States Patent
Chen et al.

(10) Patent No.: US 11,531,428 B2
(45) Date of Patent: Dec. 20, 2022

(54) METHOD FOR DRIVING TOUCH-AND-DISPLAY DEVICE, DRIVING CIRCUIT, AND TOUCH-AND-DISPLAY DEVICE

(71) Applicant: NOVATEK MICROELECTRONICS CORP., Hsinchu (TW)

(72) Inventors: Chun-Hung Chen, Taipei (TW); Kai-Wen Shao, Hsinchu (TW); Feng-Lin Chan, Zhubei (TW); Shuo-Wen Jang, Hsinchu (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/731,785

(22) Filed: Apr. 28, 2022

(65) Prior Publication Data
US 2022/0326834 A1 Oct. 13, 2022

Related U.S. Application Data

(63) Continuation of application No. 17/313,810, filed on May 6, 2021, now Pat. No. 11,353,991.
(Continued)

(51) Int. Cl.
*G06F 3/041* (2006.01)
*G09G 3/3233* (2016.01)
(Continued)

(52) U.S. Cl.
CPC .......... *G06F 3/04184* (2019.05); *G06F 3/044* (2013.01); *G09G 3/3208* (2013.01);
(Continued)

(58) Field of Classification Search
CPC ................ G06F 3/04184; G06F 3/044; G09G 3/3208; G09G 3/3233; G09G 2310/0202;
(Continued)

(56) References Cited

U.S. PATENT DOCUMENTS 9,442,615 B2 *  9/2016  Reynolds ............. G06F 3/0412
9,519,377 B2    12/2016 Ji
9,640,121 B2 *  5/2017  Munechika ......... G06F 3/04166
(Continued)

FOREIGN PATENT DOCUMENTS

CN      106323633 A     1/2017
CN      106339128 A     1/2017
(Continued)

OTHER PUBLICATIONS

Notice of Allowance, U.S. Appl. No. 17/313,810, dated Jan. 31, 2022.
(Continued)

*Primary Examiner* — Kenneth B Lee, Jr.
(74) *Attorney, Agent, or Firm* — Marshall, Gerstein & Borun LLP

(57) ABSTRACT

The disclosure provides a method for driving an OLED touch-and-display device, a driving circuit, and an OLED touch-and-display device. The method includes: generating gate driving signals that are sequentially shifted based on the first clock signal (GCK); sequentially applying the gate driving signals that are sequentially shifted to the plurality of GLs; writing display data in a display driving period for each row of pixels, to the row of pixels, wherein a time length of the display driving period depends on a corresponding gate driving signal and is smaller than the clock cycle; and for a display driving period for each of at least one row of pixels, setting a touch detection period corresponding to the display driving period or corresponding to the display driving period for previous row of pixels at least partially overlapping with the display driving period in time.

17 Claims, 11 Drawing Sheets

Related U.S. Application Data

(60) Provisional application No. 63/021,663, filed on May 7, 2020.

(51) Int. Cl.
  *G06F 3/044* (2006.01)
  *G09G 3/3208* (2016.01)

(52) U.S. Cl.
  CPC ... *G09G 3/3233* (2013.01); *G09G 2310/0202* (2013.01); *G09G 2310/0243* (2013.01); *G09G 2310/08* (2013.01); *G09G 2320/0233* (2013.01)

(58) Field of Classification Search
  CPC ....... G09G 2310/0243; G09G 2310/08; G09G 2320/0233
  See application file for complete search history.

(56) References Cited

U.S. PATENT DOCUMENTS

| | | |
|---|---|---|
| 2015/0221255 A1 | 8/2015 | Qing et al. |
| 2015/0279276 A1* | 10/2015 | Xu .................. G09G 3/3258 345/77 |
| 2015/0364083 A1 | 12/2015 | Jeon |
| 2018/0239488 A1 | 8/2018 | Lin et al. |
| 2018/0350286 A1 | 12/2018 | Lee et al. |
| 2019/0025965 A1 | 1/2019 | Yang et al. |
| 2019/0220645 A1 | 7/2019 | Ding et al. |

FOREIGN PATENT DOCUMENTS

| | | |
|---|---|---|
| CN | 107885400 A | 4/2018 |
| CN | 108459755 A | 8/2018 |
| CN | 106601173 B | 12/2019 |
| TW | 201220265 A | 5/2012 |

OTHER PUBLICATIONS

Notice of Allowance, U.S. Appl. No. 17/313,818, dated Apr. 1, 2022.

Non-final Office Action, U.S. Appl. No. 17/313,796, dated Apr. 25, 2022.

\* cited by examiner

METHOD FOR DRIVING TOUCH-AND-DISPLAY DEVICE, DRIVING CIRCUIT, AND TOUCH-AND-DISPLAY DEVICE

CROSS-REFERENCE TO RELATED APPLICATION

This application is a continuation of U.S. application Ser. No. 17/313,810, filed on May 6, 2021, which claims the priority to and benefits of U.S. provisional Application No. 63/021,663 filed on May 7, 2020 in the United States Patent and Trademark Office, the disclosure of which is incorporated by reference herein in its entirety.

TECHNICAL FIELD

The disclosure relates to a technical field of touch screens, and in particular to a method for driving a touch-and-display device, a driving circuit and a touch-and-display device.

BACKGROUND

In recent years, technologies of touch sensing have developed rapidly, and many consumer electronic products such as mobile phones, satellite navigation systems, tablet computers, personal digital assistants (PDA) and notebook computers have built-in touch functions. In the above-mentioned various electronic products, the region of the display panel is endowed with touch sensing function, that is, a display panel with simple display function is designed into a touch-and-display panel with both display and touch sensing functions. According to the different structural designs of a touch panel (touch screen or touch sensitive layer), the touch panel can be generally divided into out-cell or in-cell/on-cell touch panel. The out-cell touch panel is a combination of independent touch panel and general display panel, while the in-cell/on-cell touch panel directly sets the touch panel inside or outside the substrate in the display panel. Compared with the out-cell touch panel, the in-cell/on-cell touch panel has thinner thickness and higher light transmittance.

The touch panel is used for touch sensing operation, that is, users can touch the panel with fingers or other objects to perform various functions. The touch sensing operation of the touch panel may be interfered by the display operation of the display panel. Therefore, how to reduce the interference caused by the display operation of the display panel when the touch panel performs the touch sensing operation has become the goal of the industry.

SUMMARY

According to an aspect of the present disclosure, there is provided a method for driving an OLED touch-and-display device, the OLED touch-and-display device including a display panel including a plurality of rows of pixels, a plurality of gate driving lines (GL), and a plurality of light-emission control lines (EM) in one-to-one correspondence, wherein the method comprises: generating gate driving signals that are sequentially shifted (also referred to as "sequentially-shifted gate driving signals") according to a clock cycle of a first clock signal (GCK) based on the first clock signal; sequentially applying the gate driving signals that are sequentially shifted to the plurality of gate driving lines; for each row of pixels, writing display data in a display driving period for the row of pixels, wherein a time length of the display driving period depends on a gate driving signal applied to a gate driving line corresponding to the row of pixels and is smaller than the clock cycle of the first clock signal; and for a display driving period for each row of pixels of at least one of the plurality of rows of pixels, setting a touch detection period for touch detection corresponding to the display driving period at least partially overlapping with the display driving period in time, or setting, at least partially overlapping with the display driving period in time, a touch detection period for touch detection corresponding to a display driving period for previous row of pixels of the row of pixels.

According to another aspect of the present disclosure, there is also provided a driving circuit for a display panel in an OLED touch-and-display device, the display panel including a plurality of rows of pixels, a plurality of gate driving lines (GL), and a plurality of light-emission control lines (EM) in one-to-one correspondence, and the driving circuit is designed to execute the method as described above.

According to another aspect of the present disclosure, there is also provided an OLED touch-and-display device, which includes a display panel including a plurality of rows of pixels, a plurality of gate driving lines (GL), and a plurality of light-emission control lines (EM) in one-to-one correspondence; a touch sensitive layer and a touch controller; and the driving circuit for driving the display panel.

According to the driving method, by shortening the display driving period for each row of pixels with respect to the clock cycle that the generation of the gate driving signals that are sequentially shifted (also referred to as "the shift of the gate driving signal") is based on, i.e., shortening the data-writing time, the reserved time can be used as at least a part of the time for the touch detection operation, so that the touch detection operation is as less affected by the change in the voltage associated with the display data when the display driving is performed as possible, and in this case, by extending the time of each touch detection operation as much as possible, the real-time and accuracy of touch detection results are higher, and the touch detection period can be set only for a part of the display driving periods, thus reducing the possibility of mutual influence between touch detection and display driving, and further improving the accuracy of touch detection. In addition, in terms of frequency, since the display driving operation and the touch detection operation can also be regarded as being in a time-division manner, there is no need to consider the timing and frequency of various signals related to display driving operation when selecting the frequency of the driving signal for touch detection operation, so there can be more selectable frequencies to combat other noise sources. In addition, for the display quality of the display panel, the light-emission time length of each row of pixels is not affected, the average display luminance (related to the light-emission time length) of the plurality of rows of pixels can be approximately the same, thereby making the display luminance of the display panel uniform, so as to improve the display quality of the display panel.

BRIEF DESCRIPTION OF THE DRAWINGS

The accompanying drawings are intended to provide a further understanding of the embodiments of the disclosure and constitute a part of the specification, and together with the embodiments of the disclosure, serve to explain the disclosure, and do not constitute a limitation on the disclosure. In the drawings, the same reference numerals generally represent the same/similar components or steps.

DETAILED DESCRIPTION

Figure 1:
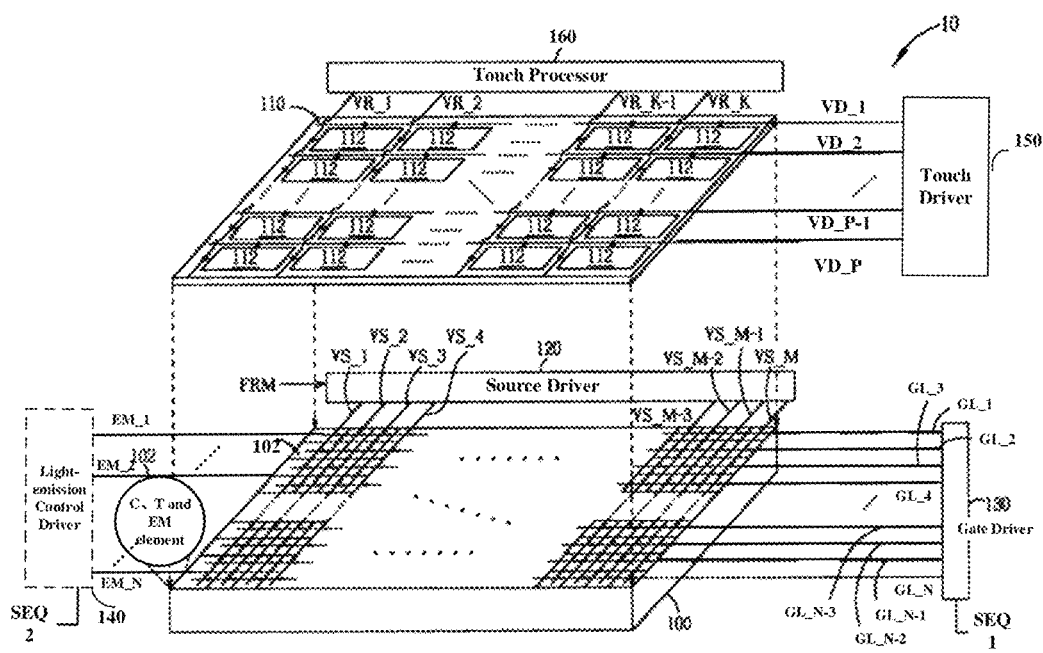
FIG. 1 is a schematic diagram of a touch-and-display device according to an embodiment of the present disclosure.

The word "coupled (or connected)" as used throughout this disclosure (including the claims) may refer to any direct or indirect connection means. For example, if it is described that the first device is coupled (or connected) to the second device, it should be interpreted that the first device can be directly connected to the second device, or the first device can be indirectly connected to the second device through other devices or some connection means. The terms "first" and "second" mentioned in the whole specification of this disclosure (including the claims) are used to name elements or distinguish different embodiments, but are not used to limit the upper limit or lower limit of the number of elements or the order of elements. In addition, wherever possible, elements/components/steps using the same reference numerals in the drawings and embodiments represent the same or similar parts. Elements/components/steps using the same reference numerals or using the same terms in different embodiments can refer to the relevant descriptions. An expression used in the singular may encompass the expression of the plural, and an expression used in the plural may also encompass the expression of the singular, unless it has been clearly defined in the context.

FIG. 1 is a schematic diagram of a touch-and-display device 10 according to an embodiment of the present disclosure.

Referring to FIG. 1, the touch-and-display device 10 includes a display panel 100, a touch sensitive layer 110, a source driver 120, a gate driver 130, a light-emission control driver 140 (which may not be provided depending on the circuit structure of the pixel unit), a touch driver 150, and a touch processor 160 (the touch driver 150 and the touch processor 160 may be collectively referred to as a touch controller). Although each driver for the display panel is shown separately in FIG. 1, as an example, respective drivers can be integrated in one circuit as a driving circuit (e.g., a driving IC), and the driving circuit can also include various computing processing functions, and each module for the touch sensitive layer (e.g., a touch driver and a touch processor) can also be integrated in one module.

The display panel 100 includes pixel units 102 arranged in a two-dimensional matrix (which may be used interchangeably with "pixel"; hereinafter), and therefore includes a plurality of gate driving lines, a plurality of data lines (source lines) arranged perpendicularly to the gate lines, and optionally a plurality of light-emission control lines (for example, in the case of adopting the circuit structure shown in FIG. 2A for the pixel unit). The pixel unit 102 includes a circuit composed of one or more capacitor, a switching element (for example, TFT), and a light-emission element (for example, an Organic Light-emission Diode (OLED)). Similarly, the touch sensitive layer 110 also includes touch sensitive cells 112 arranged in a two-dimensional matrix, thus including a plurality of touch driving lines and a plurality of touch sensing lines.

The source driver 120 generates source driving signals VS_1 to VS_M according to an image signal FRM to be displayed, so as to indicate the color intensity of pixel units 102 through data lines. The gate driver 130 sequentially generates gate driving signals GL_1-GL_N according to a timing signal SEQ1 to indicate the update timing of the pixel units 102, that is, for each row of pixels connected by each gate driving line, switching elements which are in the row of pixels and which are corresponding to the writing of data are turned on according to a gate driving signal applied to the gate driving line, so that data can be written into the row of pixels through the data lines. M and N are both integers greater than or equal to 1.

Figure 2A:
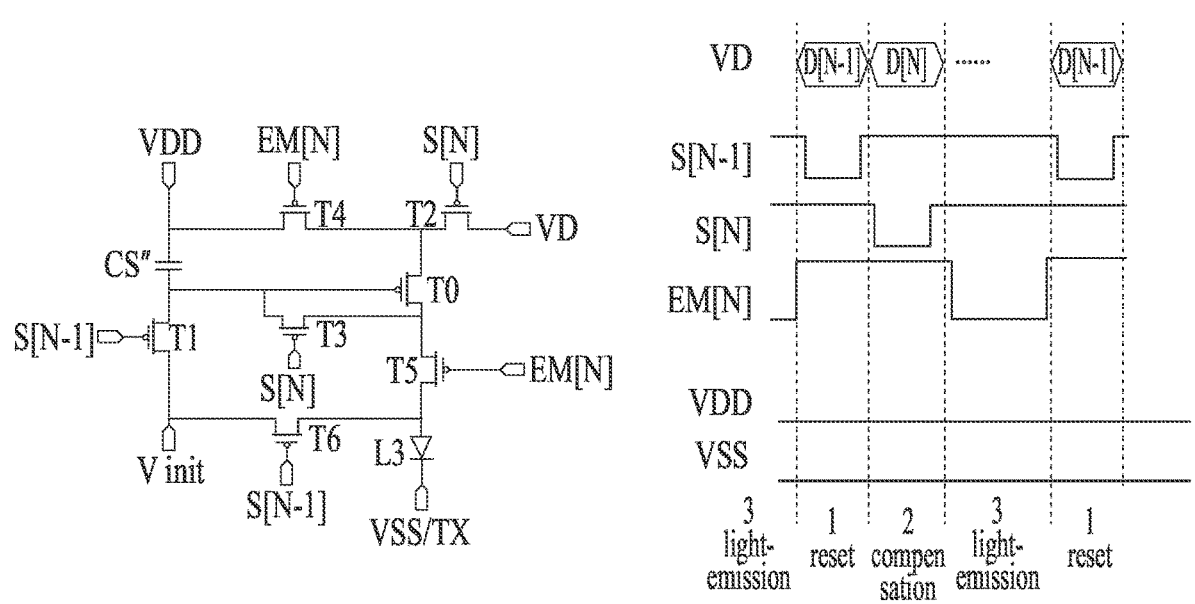
FIG. 2A shows a circuit structure diagram of a pixel unit.

Meanwhile, when the pixel unit is, for example, a pixel unit as shown in FIG. 2A, the touch-and-display device 10 should further include a light-emission control driver 140, which sequentially generates light-emission control signals EM_1 to EM_N according to a timing signal SEQ2 to indicate the light-emission timing of the pixel units 102. For each row of pixels, the gate driving signal and the light-emission control signal are in one-to-one correspondence. For each row of pixels connected to each light-emission control line, light-emission elements in the row of pixels emit light according to a light-emission control signal applied to the light-emission control line.

Meanwhile, the touch driver 150 generates a plurality of driving signals VD_1-VD_P to be applied to the touch driving lines for triggering the touch sensitive cells 112. The triggered touch sensitive cells 112 generates sensing signals (touch detection signals) VR_1 to VR_K. Since touching each touch sensitive cell 112 will change the capacitance or resistance value of the touch sensitive cell 112 (depending on whether the touch sensitive cell 112 is a capacitive or resistive sensitive cell), touch detection signals generated by the touched touch sensitive cells 112 are different from touch detection signals generated by the untouched touch sensitive cells 112. In this way, the touch processor 160 can determine the position of the touched touch sensitive cells 112 according to the change of the touch detection signals VR_1 to VR_K, where K and P are both integers greater than or equal to 1.

It should be noted that the touch-and-display device 10 can be an out-cell touch-and-display device or an in-cell/on-cell touch-and-display device, which is not limited by this disclosure. In addition, because the resolution requirement of the touch sensitive layer 110 is lower than that of the display panel 100, in order to save costs, the laying density of the touch sensitive cells 112 is lower than that of the pixel units 102.

Figure 2B:
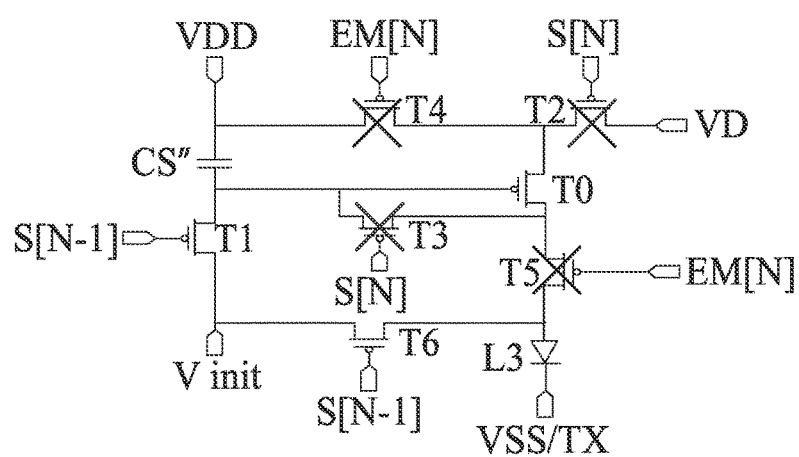
FIGS. 2B-2D show schematic diagrams of working process of the pixel unit in FIG. 2A.
Figure 2C:
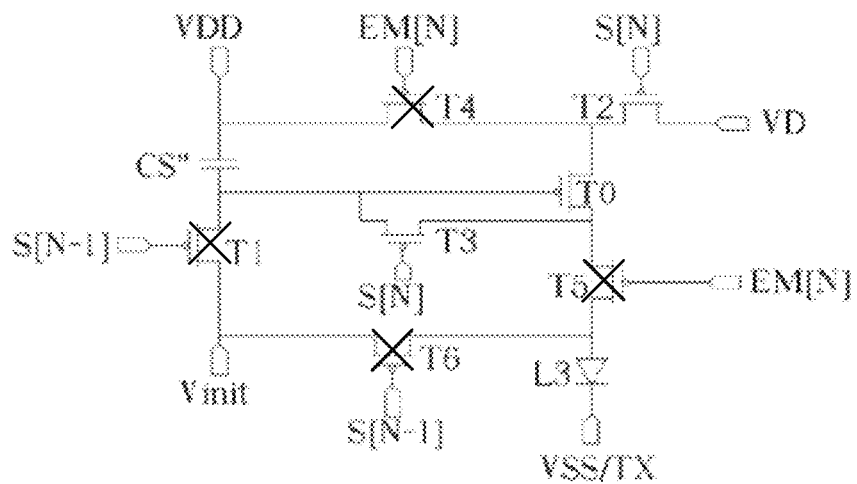
Figure 2D:
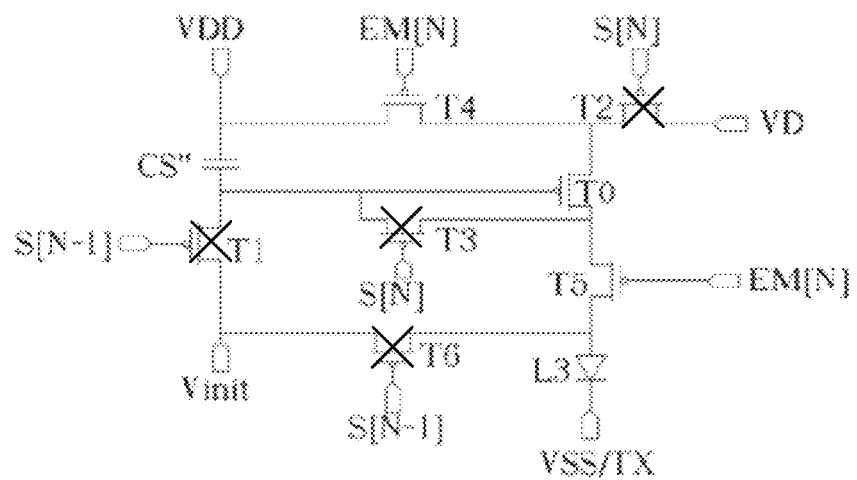

In a specific example, the circuit structure of the pixel unit 102 may be as shown in FIG. 2A, and the working process as shown in FIGS. 2B-D correspondingly.

FIG. 2A shows an exemplary circuit structure diagram of a pixel unit, and FIGS. 2B-D show schematic diagrams of the working process of the pixel unit. The pixel unit has a 7T1C structure with compensation function, which is composed of 7 TFT and 1 storage capacitor. However, it should be understood that pixel units of other structure with compensation function can also be used, for example, similar structures include 6T1C, 5T2C, etc. Alternatively, the pixel unit may also be a pixel unit having a structure without compensation function, such as 2T1C.

FIGS. 2B-D respectively show three stages of reset (1), compensation (2) and light-emission (3) of the working process of the pixel unit, in which the threshold voltage Vth of the switching element such as TFT is stored in the gate-source voltage Vgs first in the compensation stage, and the influence of Vth is counteracted by Vgs-Vth in the light-emission stage, thereby improving the current consistency in the circuit of the pixel unit.

In FIGS. 2A-D, EM[N] represents the light-emission control signal for current row of pixels (i.e., one of the signals EM_1-EM_N from the light-emission control lines in FIG. 1), and S[N] and S[N-1] respectively represent the gate driving signals for current row of pixels and previous row of pixels (i.e., two adjacent signals GL_1-GL_N from the gate driving lines in FIG. 1). In FIGS. 2A-D, low level of EM[N] and S[N] is regarded as active level, but the present disclosure is not limited to this, and active level of EM[N] and S[N] can be changed according to different specific circuits.

In the reset stage (1), as shown in FIG. 2B, the scan signal (gate driving signal) S[N] turns on the transistor T1 to pull the gate voltage of the driving transistor T0 to a lower level Vinit, so that the gate voltage can be compensated in the subsequent stage. It should be noted that the reset stage can be regarded as the end point the previous scanning cycle, and the display data VD outputs the previous piece of data D[N-1] at this time.

In the compensation stage (2), as shown in FIG. 2C, the display data VD is changed to current piece of data D[N], and the scan signal S[N] turns on the transistor T2 to write the data D[N] into the source voltage of the driving transistor T0. At this time, the transistor T3 is turned on, and the driving transistor T0 is connected in a diode-connected manner, so as to find out the threshold voltage Vth of the driving transistor T0 and eliminate the influence of the threshold voltage Vth on the luminance of the organic light-emission diode (OLED) L3, that is, compensate the luminance of the organic light-emission diode (OLED) L3.

Next, in the light-emission stage (3), as shown in FIG. 2D, the light-emission control signal EM[N] turns on the transistors T4 and T5, so that the drain current of the driving transistor T0 passes through the organic light-emission diode (OLED) L3, thereby controlling the organic light-emission diode (OLED) L3 to emit light.

In many OLED touch-and-display devices, display and touch detection are driven simultaneously. During display driving, the touch driver continuously outputs touch driving signals to a plurality of touch sensitive cells on the touch sensitive layer, and the touch processor acquires touch detection signals from the touch sensitive cells for touch detection. The touch driver and the touch processor can also be integrated into one circuit or be the same circuit. The touch sensitive cells on the touch sensitive layer can be formed based on self-capacitance and mutual-capacitance technology, and accordingly appropriate driving and sensing manners can be set, which are well known in the art, so the specific working process of touch detection will not be described here.

When display and touch detection are driven simultaneously, display and touch detection can be driven synchronously or asynchronously. For example, display and touch detection can be driven completely independently, and there is no correlation between their timings, which corresponds to the case of asynchronous driving. As another example, various timing signals for the display panel (such as VSYNC, HSYNC, GSTV, EMSTV, EMCK, etc.) can be used to generate the touch driving signals, which corresponds to the case of synchronous driving.

In addition, in the touch detection operation, a plurality of touch detection operations may be performed in each display frame, and each touch detection operation may be to perform touch detection on a part of the touch sensitive cells. For example, a plurality of touch sensitive cells on a touch sensitive layer can be divided into 20 groups, and touch detection is performed on the touch sensitive cells of each group in each touch detection operation.

Figure 3:
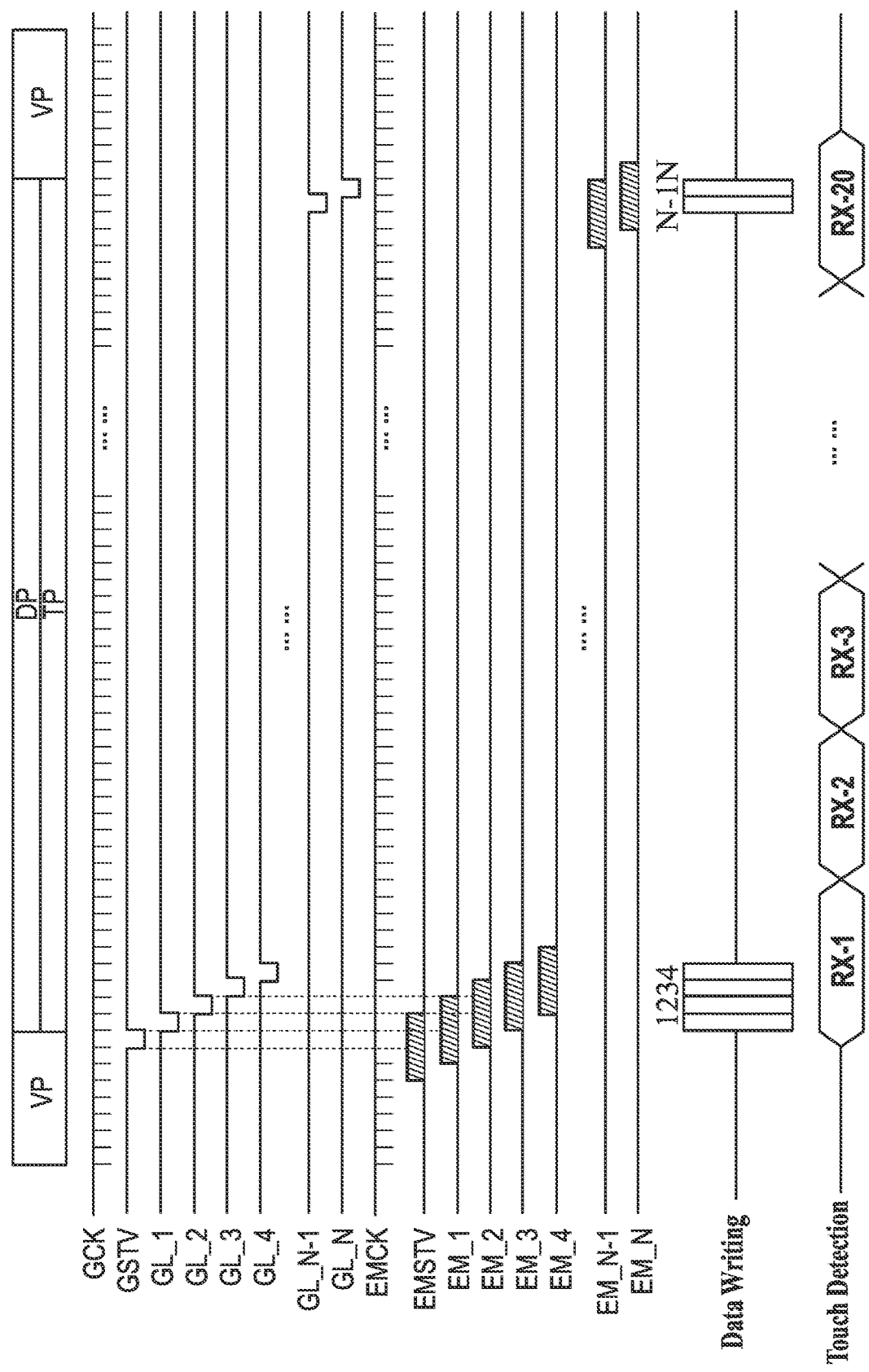
FIG. 3 shows a timing diagram related to signals generated by various drivers in the touch-and-display device.

FIG. 3 shows a timing chart related to various signals generated by each driver in the OLED touch-and-display device (taking the structure of the pixel unit shown in FIG. 2A as an example, it is also applicable to pixel units based on other structures). In FIG. 3, display and touch detection are driven simultaneously, and DP is used to represent display period, TP is used to represent touch detection period, and VP is used to represent invalid periods of each display frame.

As shown in FIG. 3, the gate driver can sequentially generate gate driving signals GL_1-GL_N according to a timing signal SEQ1 (including a first clock signal (GCK) and a first start signal (GSTV)), so as to transmit these signals to each row of pixels on the display panel (actually switching elements in pixel units). Similarly, the light-emission control driver can sequentially generate light-emission control signals EM_1 to EM_n according to another timing signal SEQ2 (including a second clock signal (EMCK) and a second start signal (EMSTV)), so as to transmit these signals to each row of pixels on the display panel respectively. In this example, active level pulse width of GSTV is equal to one clock cycle of the first clock signal (GCK), so each gate driving signal GL_1~GL_N is a pulse signal generated by shifting GSTV, and its active level pulse width is also equal to one clock cycle of the first clock signal (GCK), while inactive level pulse width of EMSTV is approximately equal to four clock cycles of the second clock signal (EMCK), therefore, each light-emission control signal EM_1~EM_N output to the light-emission control lines is a pulse signal generated by shifting EMSTV, and its inactive level pulse width is also approximately equal to four clock cycles, and the clock cycle of the first clock signal and the clock cycle of the second clock signal are equal. For each row of pixels, the gate driving signal and light-emission control signal applied to the gate driving line and light-emission control line corresponding to the row of pixels need to satisfy a specific preset timing relationship. For example, during the period when the gate driving signal is at active level, the light-emission control signal needs to maintain at inactive level, and optionally the light-emission control signal changes to active level only after a period of time after the gate driving signal changes to inactive level, as shown in FIGS. 2A and 3. In the embodiment of the present disclosure, among all the switching elements in each pixel unit included in the display panel, the low level serves as active level and the high level serves as inactive level of the switching elements, that is, the low level can turn on the switching elements in the pixel unit, while the high level can turn off the switching elements in the pixel unit. Of course, depending on the type of switching elements, the low level can be regarded as inactive level of the switching elements, and the high level can be regarded as active level of the switching elements.

Generally speaking, the driving IC (including various drivers for the display panel) can transmit the display data to the pixels on the display panel through thousands of data lines, and the gate driving signals and the light-emission control signals can be applied to each row of pixels on the display panel sequentially, the number of which depends on the resolution of the display panel. For example, the display panel can be a 2k×2k panel, which includes 2160 rows and 2160 columns of pixels, thus having 2160 data lines, 2160 gate driving signals G_1-G_2160 and 2160 light-emission control signals EM_1-EM_2160.

In the display period, for each row of pixels, under the control of active level pulse of the gate driving signal, the switching elements controlling the writing of data into the row of pixels are turned on, so that the display data can be written into the row of pixel units through the data lines. GL_1~GL_N are sequentially applied to pixel units on each gate driving line of the display panel, corresponding EM_1~EM_N are sequentially applied to pixel units on each light-emission control line of the display panel, to prohibit light-emission elements (e.g., OLED) in these pixel units from emitting light (the gates of switching elements for controlling light-emission elements to emit light in pixel units are at inactive level) when the corresponding gate driving signal is at active level. After display data is written into these pixel units by data lines, the light-emission elements in these pixel units emit light (the gates of the switching elements for controlling the light-emission elements to emit light in pixel units are at active level, which will be simply described as "making the pixel emit light" for convenience of description). It should be noted that the period of writing data into a row of pixel units through data lines should correspond to the period when the gate driving signal corresponding to the row of pixel units is at active level, and the light-emission control signal corresponding to the row of pixel units should be at inactive level to cut off the conduction path of the OLED, so as to avoid the influence of the writing of data on the display of the display panel. As shown in FIG. 3, taking the first row of pixels as an example, before GL_1 becomes active level, EM_1 has become inactive level (for example, the starting point of inactive level of EM_1 is ahead of the starting point of active level of GL_1 for a preset period of time, which is shown as two clock cycles, but it can also be other clock cycles), and during the period when GL_1 is active level, EM_1 maintains at inactive level and the data is written into the first row of pixels, and EM_1 maintains at inactive level until a period of time after the GL_1 becomes inactive level again ends (the period of time is illustrated as one clock cycle in the figure, but can be other number of clock cycles).

As mentioned earlier, in OLED touch-and-display devices, display and touch detection are mostly driven simultaneously, in this case, there are the following defects.

(1) With regard to power consumption: in the case of simultaneous driving, display driving related noises can be detected during touch detection, and in order to suppress these noises, it is necessary to increase the time of touch detection, so as to suppress noises by receiving data acquired for a longer time, however, this method requires a longer detection time, and therefore consumes more power.

(2) With regard to touch detection frequency (i.e., the frequency of touch driving signals): in the case of simultaneous driving, the touch detection frequency will involve the frequency of display driving related signals, that is, the frequency of touch driving signals needs to be selected to avoid the frequency that may seriously interfere with the display driving. Generally speaking, besides the frequency of display driving, various unavoidable external noises (such as power noise, etc.) need to be considered in the selection of the frequency of touch driving signals, therefore, the problem of interference to the frequency of display driving leads to more limited selection of the frequency of touch driving signals.

In addition, no matter whether synchronous or asynchronous driving methods are adopted, gate driving is also performed on the display panel to scan each row of pixels during the touch detection operation, and different data voltages (voltages associated with display data) are also transmitted on the data lines according to different display screen contents, and these display screen contents are usually unpredictable by the touch processor, and due to factors such as parasitic capacitance between the data lines and the touch sensitive cells, changes of these data voltages may cause unexpected interference, i.e., noise, during the touch detection operation. In this way, the touch processor can only use longer time for touch detection, so as to obtain more real touch sensing signals through longer time detection, so as to improve the signal-to-noise ratio (SNR) and avoid false touch detection results due to poor SNR.

Therefore, in the embodiment of this disclosure, it is proposed to adopt time-division manner for driving touch detection and display in OLED touch-and-display devices. In this way, there is no noise interference from the display driving operation when the touch detection operation is performed, so that the touch detection does not take a longer time, and therefore power can be saved. In addition, under the condition that touch detection and display are driven in a time-division manner, there is no need to consider the timing and frequency of various signals related to display driving operation when selecting the frequency of the driving signal for touch detection operation, so there can be more selectable frequencies to combat other noise sources.

In addition, in the design process, it is necessary to make the display luminance of the display panel of the touch-and-display device uniform. Because the average display luminance of each row of pixels is related to its light-emission time length, when it is refined to each row of pixels, it is expected that the light-emission time lengths of all rows of pixels are equal, so that the display luminance of display panel is uniform and the display quality is relatively good.

Therefore, the present disclosure proposes a method for driving an OLED touch-and-display device, in which by shortening the display driving period for each row of pixels with respect to the clock cycle that the shift of the gate driving signal is based on, i.e., shortening the data-writing time, the reserved time can be used as at least a part of the time for the touch detection operation, so that the touch detection operation is as less affected by the change in the voltage associated with the display data when the display driving is performed as possible. Furthermore, the light-emission control manners of all rows of pixels are the same, and the method does not change the timing of each light-emission control signal if there is a light-emission control signal provided to each row of pixels, so the light-emission time lengths of all rows of pixels on the display panel are approximately equal, thereby making the display luminance of the display panel uniform, so as to improve the display quality.

Figure 4A:
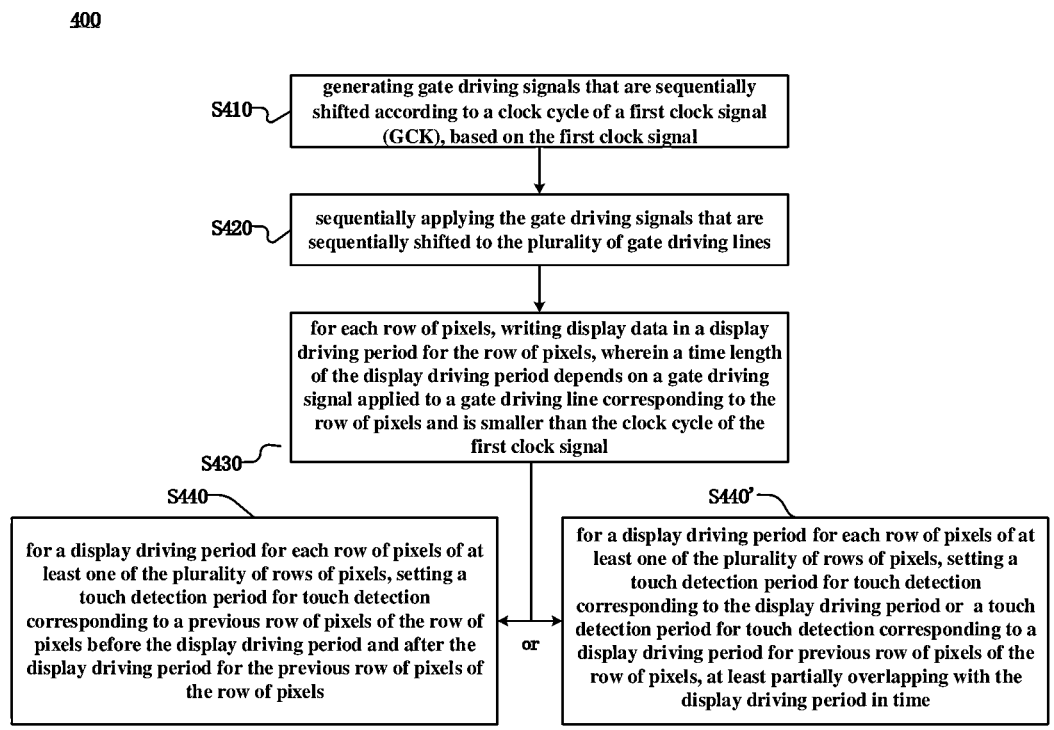
FIG. 4A shows a flowchart of a method for driving the OLED touch-and-display device according to an embodiment of the present disclosure.

FIG. 4A shows a flowchart of a method for driving an OLED touch-and-display device according to an embodiment of the present disclosure. FIGS. 4B-4E show schematic timing diagrams about setting touch detection periods according to an embodiment of the present disclosure. The OLED touch-and-display device comprises a display panel, and the display panel comprises a plurality of rows of pixels and a plurality of gate driving lines (GL) in one-to-one correspondence.

It should be noted that although the steps described in FIG. 4A and the methods to be described later are shown in a sequential manner, it does not mean that they must be executed in the order shown, and they can be executed in any suitable other order or in intersection, which is not limited by the present disclosure as long as the goal that the method aims to achieve can be achieved.

As shown in FIG. 4A, in step S410, gate driving signals that are sequentially shifted according to a clock cycle of a first clock signal (GCK) are generated based on the first clock signal.

Optionally, the gate driving signals are pulse signals, and the time length between starting points of the active level pulses of two adjacent gate driving signals is equal to the clock cycle of the first clock signal.

At step S420, the gate driving signals that are sequentially shifted are sequentially applied to the plurality of gate driving lines.

Optionally, a first start signal (GSTV) is generated, and the first start signal is shifted by one clock cycle according to the first clock signal, as a first gate driving signal, the first gate driving signal is applied to the first gate driving line on the first row corresponding to the first row of pixels, then the first gate driving signal is continuously shifted according to the first clock signal and applied to another gate driving line on another row, and so on.

At step S430, for each row of pixels, display data is written to the row of pixels in a display driving period for the row of pixels, in which the time length of the display driving period depends on a gate driving signal applied to a gate driving line corresponding to the row of pixels and is smaller than the clock cycle of the first clock signal.

That is, for each row of pixels, display data is written into the row of pixels through a plurality of data lines in a case where the gate driving signal for the row of pixels is at active level, and a period in which the gate driving signal is at active level is referred to as a display driving period in this disclosure. In addition, since the time length of the display driving period is smaller than the clock period of the first clock signal, there is a time interval between the gate driving signals for two adjacent rows of pixels.

Therefore, this time interval can be used for touch detection, so that the following two situations may exist:

A. only using the time interval to perform the touch detection; and

B. using the time interval and at least a part of the display driving period for one row of pixels to perform the touch detection.

In addition, in both situations of A and B as described above, touch detection can be performed using the time intervals after the display driving periods for only a part (at least one) of the plurality of rows of pixels of the display panel. That is, it is not necessary to set the touch detection period after the display driving period for each row of pixels, but the touch detection periods may be set only after the display driving periods for some rows of pixels. For example, one touch detection period can be set for every four rows of pixels, that is, touch detection periods are correspondingly set after the display driving periods for the first row of pixels, the fifth row of pixels, the ninth row of pixels, etc. Of course, the time intervals between every two adjacent touch detection periods can also be unequal, for example, touch detection periods are correspondingly set after the display driving periods for the first row of pixels, the fourth row of pixels, the tenth row of pixels, etc.

As described in step S440, for situation A, for the display driving period for each row of pixels of at least one of the plurality of rows of pixels, a touch detection period for touch detection corresponding to a previous row of pixels of the row of pixels is set before the display driving period and after the display driving period for the previous row of pixels of the row of pixels.

Figure 4B:
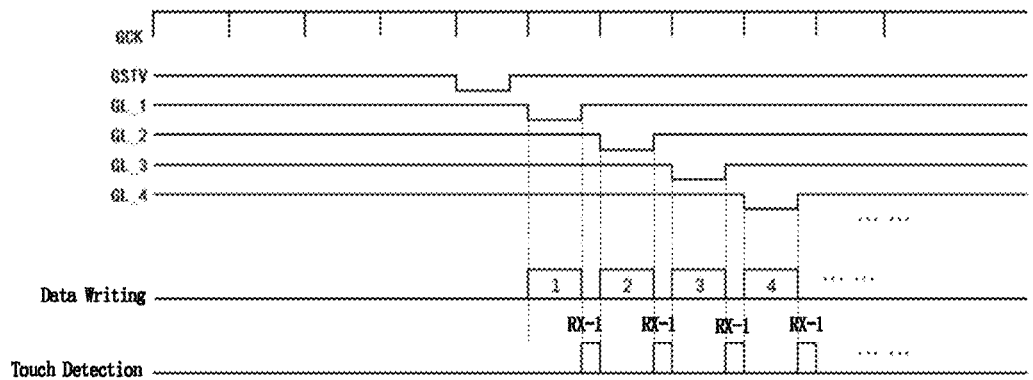
FIGS. 4B-4E show schematic timing diagrams about setting touch detection periods according to an embodiment of the present disclosure.

As shown in FIG. 4B, one touch detection period is set after each display driving period (which is only an example here, the touch detection periods can also be set intermittently, as described above). In other words, the clock cycle of the first clock signal (GCK) is divided into a display driving period and a touch detection period, and touch detection is performed after the end point the display driving period, so as to avoid the noise caused by the touch detection result of touch detection being affected by the change in voltage associated with the display data. Optionally, there may be a small gap between the display driving period and the touch detection period. In FIG. 4B, the pulse width of the active level pulse of the gate driving signals GL_1, GL_2, etc. is shortened accordingly to control the switching elements in the pixel units to be properly turned on and off. In FIG. 4B, starting from the second row of pixels, a touch detection period corresponding to the display driving period for the first row of pixels is set in the time interval before the display driving period for the second row of pixels and after the display driving period for the first row of pixels, and a touch detection period corresponding to the display driving period for the second row of pixels is set before the display driving period of the third row of pixels and after the display driving period for the second row of pixels, and so on, until the display driving period for the last row of pixels in the display frame ends.

As will be described in conjunction with FIG. 5, a plurality of touch sensitive cells on the touch sensitive layer are divided into a plurality of groups and distributed in a plurality of touch detection periods for touch detection. The touch detection of a part of touch sensitive cells is performed in each touch detection period. For example, in FIG. 4B, the first four touch detection periods shown are for the touch detection of the first group of touch sensitive cells (denoted as RX-1), and subsequent unshown touch detection periods can be for touch detection of the remaining touch sensitive cells (RX-1) of the first group of touch sensitive cells and for other groups of touch sensitive cells (RX-i), where i is an integer greater than 1.

In the above method, by shortening the display driving period for each row of pixels with respect to the clock cycle which the shift of the gate driving signal is based, i.e., shortening the data-writing time, the reserved time can be used as at least a part of the time for the touch detection operation, so that the touch detection operation is not affected by the change in voltage associated with the display data when the display driving is performed.

The length of touch detection period is related to the accuracy of touch detection results, therefore, in order to properly improve the accuracy of touch detection, the time length of touch detection period can be appropriately increased under the condition of satisfying the above-mentioned time-division driving of display and touch detection. Instead of step S440, in step S440', for situation B, for a display driving period for each row of pixels of at least one of the plurality of rows of pixels, a touch detection period for touch detection corresponding to the display driving period is set at least partially overlapping with the display driving period in time, or a touch detection period for touch detection corresponding to a display driving period for previous row of pixels of the row of pixels is set at least partially overlapping with the display driving period in time.

Optionally, for the display driving period for each row of pixels of at least one of the plurality of rows of pixels, the voltages associated with the display data applied to data lines charge the capacitors in the pixel units of the row of pixels, so as to realize data-writing to the pixels. Within a first time period after the starting point of the display driving period for each row of pixels, the voltages associated with the display data will also have a buffering process when being applied to the data lines (because there is parasitic capacitance between the reference ground and each data line), therefore, the voltages on the data lines gradually rise from a relatively small value (e.g., 0), at the same time, the voltages on the data lines, as the charging voltages of the capacitors in the pixel units, also gradually rise from a relatively small value (e.g., 0), so the voltage on each data line has a smaller variation range. In addition, within a second preset time period before the end point the display driving period for each row of pixels, since the capacitor charging in each pixel unit has been completed, the voltage on each data line is basically stable. Therefore, the touch detection operation will not suffer too much noise in these two preset time periods, and the touch detection signals obtained by the touch detection operation in these two preset time periods can still possess good accuracy. Therefore, it is possible to set a touch detection period after the display driving period for the previous row of pixels of the row of pixels, and the touch detection period extends to a preset time period (the first time period mentioned before) after the start point of the display driving period for the row of pixels, or it is possible to set the start point of the touch detection period within another preset time period (the second time period mentioned before) before the end point the display driving period for the previous row of pixels of the row of pixels and extend the touch detection period to the start point of the display driving period for the row of pixels (equivalent to setting a touch detection period partially overlapping a corresponding display driving period).

Figure 4C:
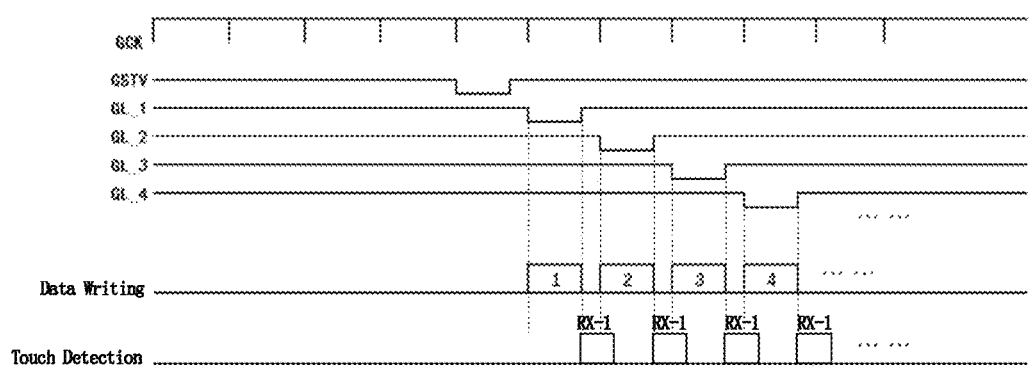

As shown in FIG. 4C, the touch detection period is set within a time interval after the display driving period for the previous row of pixels and the first preset time period after the starting point of the display driving period for current row of pixels. Although it is shown in the FIG. 4C that the touch detection period follows immediately the display driving period for the previous row of pixels, this is not necessary, and the touch detection may start after a short time after the end point the display driving period for the previous row of pixels. Although in FIG. 4C, the touch detection periods are illustrated to be set after each display driving period, but they may be set intermittently, as described above. In the FIG. 4C, the pulse width of the active level pulse of the gate driving signals GL_1, GL_2, etc., is shortened with respect to the clock cycle, so as to control the switching elements in the pixel units to be properly turned on and off. The touch detection period corresponding to the first display driving period extends to the second display driving period, the touch detection period corresponding to the second display driving period extends to the third display driving period, and so on, until the display driving period for the last row of pixels in the display frame ends.

Similarly, the touch detection of a part of touch sensitive cells is performed in each touch detection period. For example, in FIG. 4C, the first four touch detection periods shown are for the touch detection of the first group of touch sensitive cells (denoted as RX-1), and subsequent unshown touch detection periods can be for touch detection of the remaining touch sensitive cells (RX-1) of the first group of touch sensitive cells and other groups of touch sensitive cells (RX-i), where i is an integer greater than 1.

Optionally, the second preset time period before the end point of the display driving period and the time interval between the display driving period and the display driving period for the next row of pixels may also be taken as the touch detection period corresponding to the display driving period.

Figure 4D:
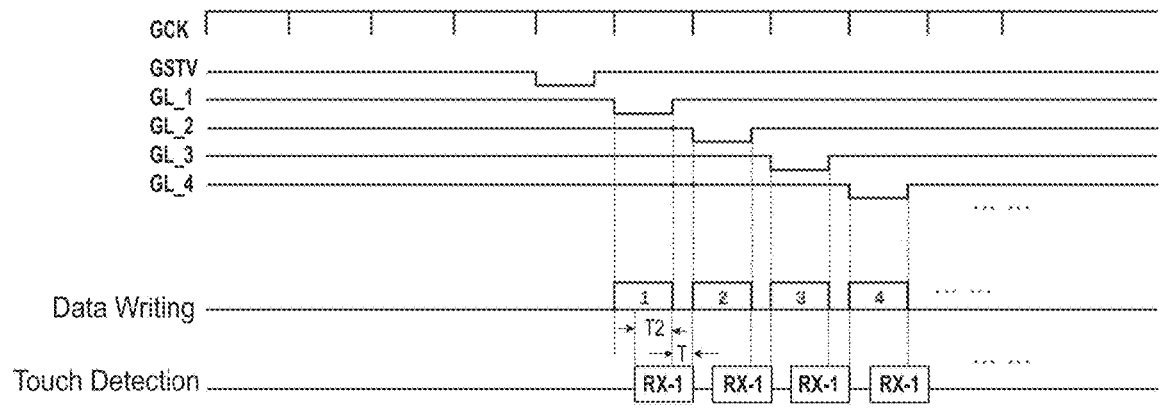

As shown in FIG. 4D, the second preset time period (T2) before the end point of each display driving period and the time interval (T) between two display driving periods together serve as a touch detection period (which is only an example here, the touch detection periods can also be set intermittently, as described above), and each display driving period partially overlaps with the corresponding touch detection period (overlapping time period T2). In the FIG. 4D, the pulse width of the active level pulse of the gate driving signals GL_1, GL_2, etc., is shortened with respect to the clock cycle, so as to control the switching elements in the pixel units to be properly turned on and off. The touch detection period corresponding to the first display driving period has a time length of T2+T, the touch detection period corresponding to the second display driving period has a time length of T2+T, and so on, until the display driving period for the last row of pixels in the display frame ends.

In this case, because the change in voltage associated with the display data on each data line is small in the second preset time period before the end point the display driving period, it still does not cause too much noise to the touch detection operation, thus the touch detection signals obtained by the touch detection operation within the second preset time period can still possess good accuracy.

Similarly, the touch detection of a part of touch sensitive cells is performed in each touch detection period. For example, in FIG. 4D, the first four touch detection periods shown are for the touch detection of the first group of touch sensitive cells (denoted as RX-1), and subsequent unshown touch detection periods can be for touch detection of the remaining touch sensitive cells (RX-1) of the first group of touch sensitive cells and other groups of touch sensitive cells (RX-i), where i is an integer greater than 1.

Optionally, the starting point of each display driving period may be taken as the starting point of the touch detection period corresponding to the display driving period, and the time length of the touch detection period corresponding to the display driving period may be set equal to the clock cycle of the first clock signal and longer than the time length of the display driving period.

Figure 4E:
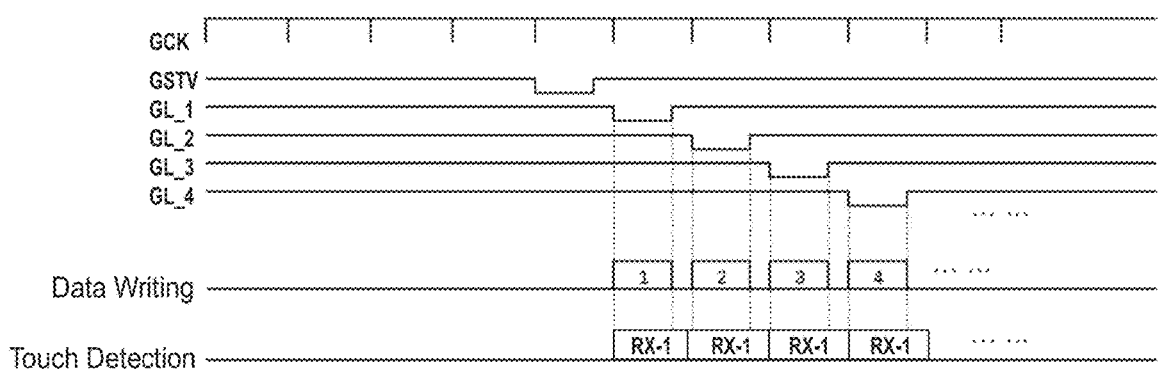

As shown in FIG. 4E, a starting point of a touch detection period is set at the starting point of each display driving period (which is only an example here, the touch detection periods can also be set intermittently, as described above), and the touch detection period is extended to the starting point of the next display driving period, that is, the touch detection period occupies the whole clock cycle, and its corresponding display period overlaps with the touch detection period. In the FIG. 4E, the pulse width of the active level pulse of the gate driving signals GL_1, GL_2, etc., is shortened with respect to the clock cycle, so as to control the switching elements in the pixel units to be properly turned on and off. The touch detection period corresponding to the first display driving period occupies the whole clock cycle, the touch detection period corresponding to the second display driving period occupies the whole clock cycle, and so on, until the display driving period for the last row of pixels in the display frame ends.

In this case shown in FIG. 4E, each display driving period overlaps with its corresponding touch detection period to a certain extent, and the touch detection operation will be affected more relative to the case shown in FIGS. 4A-4D, however, because each display driving period has been shortened (relative to the clock cycle of the first clock signal), the influence of the display driving operation on the touch detection operation can still be reduced compared with the influence in the case where each display driving period is not shortened.

Similarly, the touch detection of a part of touch sensitive cells is performed in each touch detection period. For example, in FIG. 4E, the first four touch detection periods shown are for the touch detection of the first group of touch sensitive cells (denoted as RX-1), and subsequent unshown touch detection periods can be for touch detection of the remaining touch sensitive cells (RX-1) of the first group of touch sensitive cells and other groups of touch sensitive cells (RX-i), where i is an integer greater than 1.

With the above method, the display and the touch detection are driven in a time-division manner as much as possible to reduce most of influence of the display driving operation on the touch detection operation, and the time for performing each touch detection operation is prolonged as much as possible by overlapping the touch detection period with its corresponding display driving period, so that the real-time and accuracy of touch detection results are higher. In addition, the touch detection period can be set only for a part of the display driving periods, thus reducing the possibility of mutual influence between touch detection and display driving, and further improving the accuracy of touch detection.

It should be noted that in the above-mentioned various cases of the embodiments of the present disclosure, the display driving period is shortened relative to the clock cycle of the first clock signal for generating the gate driving signals that are sequentially shifted, but this shortening is not arbitrary because during the display driving period, it is required to write data to the pixel units through voltages associated with the display data on the data lines (to charge capacitors in the pixel units), therefore, the shortened display driving period should enable the data-writing of corresponding pixel units (completion of charging of capacitors in the pixel units), the lower limit of the time length of the shortened display driving period can be set by comprehensively considering the number of pixel rows, the display frame rate, the capacitance in each pixel unit, and the design of the driving circuit (for example, including a gate driver, a source driver, etc.).

In addition, for each row of pixels, voltages associated with display data are applied to a plurality of data lines during the display driving period for the row of pixels, to write the display data to the row of pixels. For example, voltages are respectively input to a plurality of pixels on the row through a plurality of data lines VS_1-VS_M as shown in FIG. 1. With regard to the voltages on the data lines, the driving method may further include the step: applying a constant voltage associated with preset display data to the plurality of data lines or causing the plurality of data lines to maintain at voltages associated with current display data, after a display driving period for each row of pixels of at least one of the plurality of rows of pixels of the display panel ends. In this way, during the touch detection period, the influence of noise caused by the display driving of the display panel is reduced as much as possible, and at this time, because the gate driving signal applied on any gate driving line on the display panel is inactive, the data-writing will not be performed, so the voltages on the data lines can maintain at any voltage without affecting current displaying.

The above description is about how to set the touch detection period, and the following description is about the specific touch detection operation in the touch detection period.

As mentioned above, the OLED touch-and-display device also includes a touch sensitive layer, which includes a plurality of touch sensitive cells. Generally, it is hoped that at least one touch scan (touch detection) can be completed for each touch sensitive cell within one display frame, for example, two touch scans can be completed within one display frame. Therefore, it is necessary to complete scanning (touch detection) of these touch sensitive cells in the touch detection periods described above with reference to FIGS. 4A to 4E within one display frame.

Figure 5:
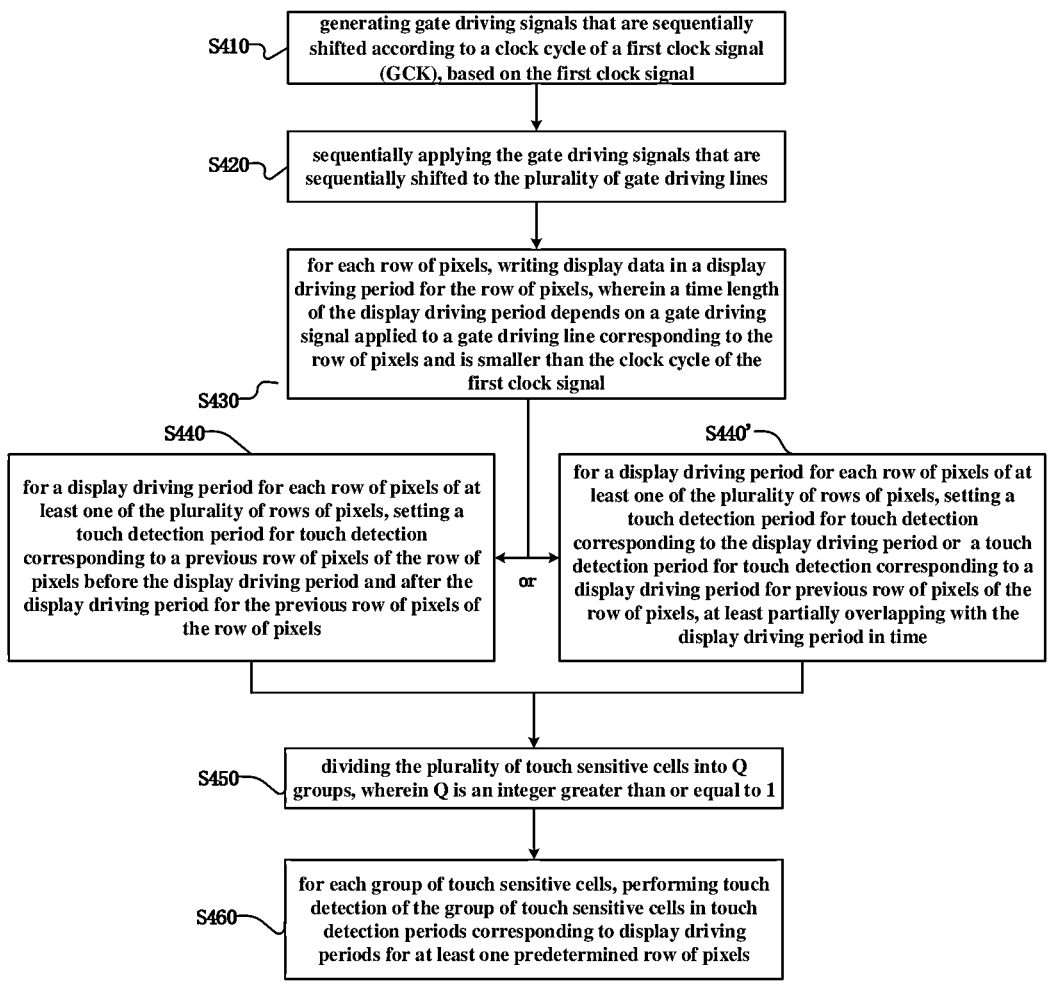
FIG. 5 shows a flowchart of another method for driving an OLED touch-and-display device according to an embodiment of the present disclosure.

FIG. 5 shows a flowchart of another method for driving an OLED touch-and-display device according to an embodiment of the present disclosure. As shown in FIG. 5, in addition to steps S410-440(440') described with reference to FIG. 4A, the method may further include the following steps.

At step S450, the plurality of touch sensitive cells are divided into Q groups, where Q is an integer greater than or equal to 1.

For example, in a touch-and-display device, the number of touch sensitive cells may be the same as or different from the number of pixels on the display panel. For example, it is assumed that there are 1200 touch sensitive cells (taking the touch sensitive cells in the form of self-capacitance as an example) on the touch sensitive layer, and these touch sensitive cells are divided into 20 groups with 60 touch sensitive cells in each group.

At step S460, for each group of touch sensitive cells, touch detection of the group of touch sensitive cells is performed in touch detection periods corresponding to display driving periods for at least one predetermined row of pixels.

Optionally, the at least one predetermined row of pixels may include the plurality of rows of pixels of the display panel (e.g., a touch detection period is set for the display driving period for each row of pixels), or may include at least one row of pixels of the plurality of rows of pixels (e.g., touch detection periods are intermittently set for the display driving period for each row of pixels).

Optionally, the touch detection of each group of touch sensitive cells is performed within one or more touch detection periods.

In other words, in some cases, the touch detection of all touch sensitive cells in a group can be completed in one touch detection period; however, in most other cases, if touch detection of all touch sensitive cells in the group cannot be completed in one touch detection period, the group of touch sensitive cells can be distributed to multiple touch detection periods for touch detection. For example, in a case where one touch detection period is set after each display driving period or one touch detection periods is set intermittently after several display driving periods, if each group includes 60 touch sensitive cells, but touch detection can only be performed for 10 touch sensitive cells per touch detection period, so every 6 consecutive touch detection periods can be used for touch detection of one group of touch sensitive cells.

Optionally, for touch detection of each group of touch sensitive cells, within the one or more touch detection periods, touch driving signals are simultaneously applied to each touch sensitive cell in the group of touch sensitive cells, and touch detection signals are simultaneously or sequentially acquired from the group of touch sensitive cells; or, within the one or more touch detection periods, touch driving signals are sequentially applied to each touch sensitive cell in the group of touch sensitive cells, and a touch detection signal is acquired from this touch sensitive cell.

Taking FIG. 4C as an example, assuming that the touch detection of the first group of touch sensitive cells is performed within the first four touch detection periods (RX-1) shown, touch driving signals can be applied to each touch sensitive cell in the first group of touch sensitive cells at the same time or sequentially within the four touch detection periods (as time goes on, touch driving signals are applied to all touch sensitive cells in the first group in each of the four touch detection periods or applied sequentially), and touch detection signals can be acquired sequentially, or can be acquired simultaneously (for the case of touch driving signals being applied sequentially).

Optionally, since the touch detection of the group of touch sensitive cells can be performed in one or more touch detection periods, each touch detection period is associated with at least a part of the touch sensitive cells in the group, so it is also possible to, within each touch detection period of the one or more touch detection periods, simultaneously apply touch driving signals to the at least a part of the touch sensitive cells associated with the touch detection period, and simultaneously or sequentially acquire touch detection signals from the at least a part of the touch sensitive cells; or, it is possible to, within each touch detection period of the one or more touch detection periods, sequentially apply touch driving signals to each touch sensitive cell associated with the touch detection period, and acquire a touch detection signal from this touch sensitive cell.

Taking FIG. 4C as an example, assuming that the touch detection of the first group of touch sensitive cells is completed within the first four touch detection periods (RX-1) shown, touch detection is performed for a part of the touch sensitive cells in the group within each touch detection period. In the first touch detection period, touch driving signals can be applied to each of the touch sensitive cells in the part of touch sensitive cells simultaneously or sequentially, and touch detection signals can be acquired sequentially or can be acquired simultaneously (for the case of touch driving signals being applied sequentially).

In addition, in other implementations, only the acquisition of the touch detection signals is performed in the touch detection period, and the application of the touch driving signals may be performed at other time other than each touch detection period.

Therefore, optionally, for each group of touch sensitive cells, it is also possible to, within the display frame to which the one or more touch detection periods belong, continuously apply touch driving signals to the group of touch sensitive cells, and within the one or more touch detection periods, acquire touch detection signals from the group of touch sensitive cells; or, it is possible to, only within the one or more touch detection periods, apply touch driving signals to the group of touch sensitive cells, and acquire touch detection signals from the group of touch sensitive cells.

Taking FIG. 4C as an example, assuming that the touch detection of the first group of touch sensitive cells is completed within the first four touch detection periods (RX-1) shown, touch driving signals can be applied to the first group of touch sensitive cells within the entire display frame, but the touch detection signals of the first group of touch sensitive cells are acquired only within the four touch detection periods. Of course, as described above, it is also possible to apply touch driving signals to the first group of touch sensitive cells and acquire touch detection signals, only within the four touch detection periods.

Optionally, for each of the one or more touch detection periods, within a display frame to which the touch detection period belongs, touch driving signals are continuously applied to a part of the touch sensitive cells associated with the touch detection period, and within the touch detection period, touch detection signals are simultaneously or sequentially acquired from the group of touch sensitive cells; or, for each of the one or more touch detection periods, in a display frame to which the touch detection period belongs, only within the touch detection period, touch driving signals are simultaneously applied to the part of touch sensitive cells associated with the touch detection period, and touch detection signals are simultaneously or sequentially acquired from the part of touch sensitive cells, or, only within the touch detection period, touch driving signals are sequentially applied to the part of touch sensitive cells associated with the touch detection period, and touch detection signals are sequentially acquired from the part of touch sensitive cells.

Taking FIG. 4C as an example, assuming that the touch detection of the first group of touch sensitive cells is completed within the first four touch detection periods (RX-1) shown, within the entire display frame, touch driving signals can be continuously applied to a part of touch sensitive cells associated with the first touch detection period, but only within the first touch detection period, touch detection signals of the part of touch sensitive cells are acquired. Of course, as described above, it is also possible to, only within the touch detection period, apply touch driving signals to the part of touch sensitive cells and acquire the touch detection signals.

If there are enough touch detection periods in one display frame, for example, for the above specific example, only 120 touch detection periods may be needed for 1200 touch sensitive cells on the touch sensitive layer (every 6 touch detection periods are used for one group of touch sensitive cells, totaling 20 groups of touch sensitive cells), but there may be 240 touch detection periods, so multiple rounds of touch detection can be performed for all touch sensitive cells on the touch sensitive layer to improve touch detection. In this case, the touch detection of each touch sensitive cell may be performed in a plurality of touch detection periods.

According to the method, by shortening the display driving period for each row of pixels with respect to the clock cycle that the generation of the gate driving signals that are sequentially shifted is based on, i.e., shortening the data-writing time, the reserved time can be used as at least a part of the time for the touch detection operation, so that the touch detection operation is as less affected by the change in the voltage associated with the display data when the display driving is performed as possible, and in this case, by extending the time of each touch detection operation as much as possible, the real-time and accuracy of touch detection results are higher, and the touch detection period can be set only for a part of the display driving periods, thus reducing the possibility of mutual influence between touch detection and display driving, and further improving the accuracy of touch detection. In addition, in terms of frequency, since the display driving operation and the touch detection operation can also be regarded as being in a time-division manner, there is no need to consider the timing and frequency of various signals related to display driving operation when selecting the frequency of the driving signal for touch detection operation, so there can be more selectable frequencies to combat other noise sources.

The above-mentioned method can be applied to the case that each pixel unit of the display panel of the OLED touch-and-display device is a pixel unit that does not include a structure controlled by a light-emission control signal. In this case, the light-emission control mode of each row of pixels is the same, so the light-emission time lengths of all rows of pixels are equal, and display luminance of display panel is uniform, and the display quality is relatively good.

In addition, when the pixel unit has a circuit structure with a compensation function as shown in FIG. 2A, it is also necessary to generate sequentially-shifted light-emission control signals.

Figure 6:
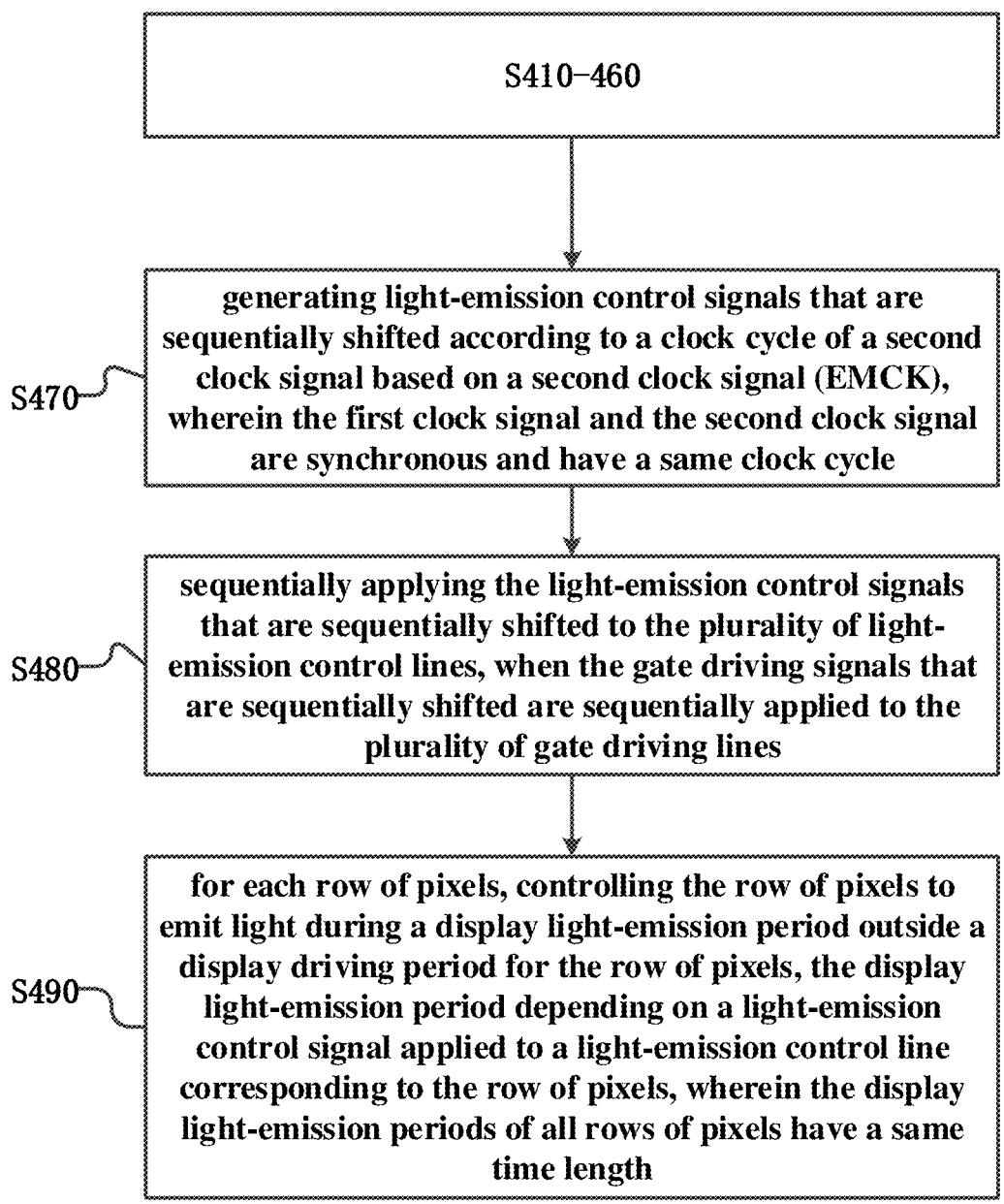
FIG. 6 shows a flowchart of yet another method for driving an OLED touch-and-display device according to an embodiment of the present disclosure.

FIG. 6 shows a flowchart of yet another method for driving an OLED touch-and-display device according to an embodiment of the present disclosure, which is used for an OLED touch-and-display device including a display panel with a pixel unit of a circuit structure with a compensation function. At this time, the display panel also includes a plurality of light emission control lines, and the plurality of light emission control lines, the plurality of rows of pixels and the plurality of gate driving lines are in one-to-one correspondence. As shown in FIG. 6, in addition to steps S410-460 described with reference to FIGS. 4A and 5, the driving method may further include the following steps.

At step S470, light-emission control signals that are sequentially shifted according to a clock cycle of a second clock signal (EMCK) are generated based on the second clock signal, wherein the first clock signal and the second clock signal are synchronous and have the same clock cycle.

Optionally, the light-emission control signal is a pulse signal, and the time length between starting points of active level pulses of two adjacent light-emission control signals is equal to the clock cycle of the second clock signal (that is, the clock cycle of the first clock signal). It should be understood that although the first clock signal (GCK) and the second clock signal (EMCK) are respectively given in this disclosure, only one clock signal may be used as the first clock signal (GCK) and the second clock signal (EMCK) in the case where the first clock signal and the second clock signal have the same clock cycle.

At step S480, when the gate driving signals that are sequentially shifted are sequentially applied to the plurality of gate driving lines, the light-emission control signals that are sequentially shifted are sequentially applied to the plurality of light-emission control lines.

Optionally, similar to the application of the gate driving signals, a second start signal (EMSTV) is first generated, the second start signal is shifted by one clock cycle according to the second clock signal, as a first gate driving signal, the first gate driving signal is applied to the light-emission control line on the first row corresponding to the first row of pixels, then the first light-emission control signal is continuously shifted according to the second clock signal and applied to another light-emission control line on another row, and so on.

At step S490, for each row of pixels, the row of pixels are controlled to emit light during a display light-emission period outside a display driving period for the row of pixels, the display light-emission period depending on a light-emission control signal applied to a light-emission control lines corresponding to the row of pixels, in which the display light-emission periods of all rows of pixels have a same time length.

Figure 7:
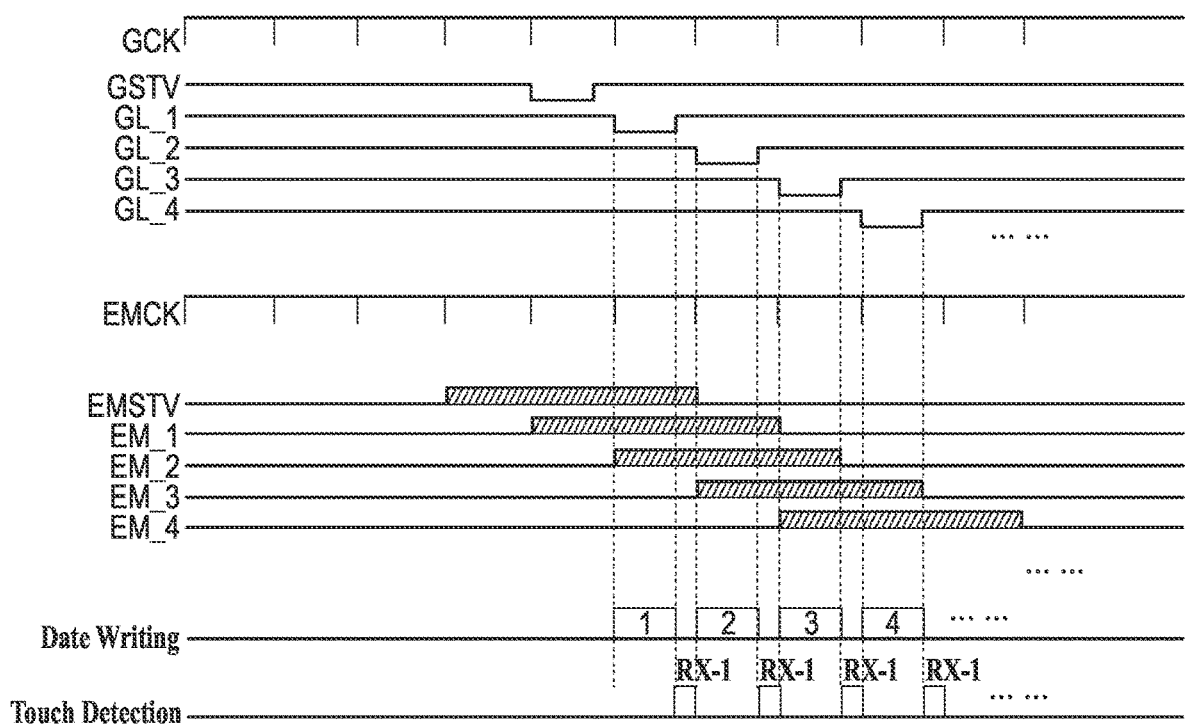
FIGS. 7-10 show schematic timing diagrams about setting touch detection periods in the case where there is a light-emission control signal provided to each row of pixels, according to an embodiment of the present disclosure.
Figure 8:
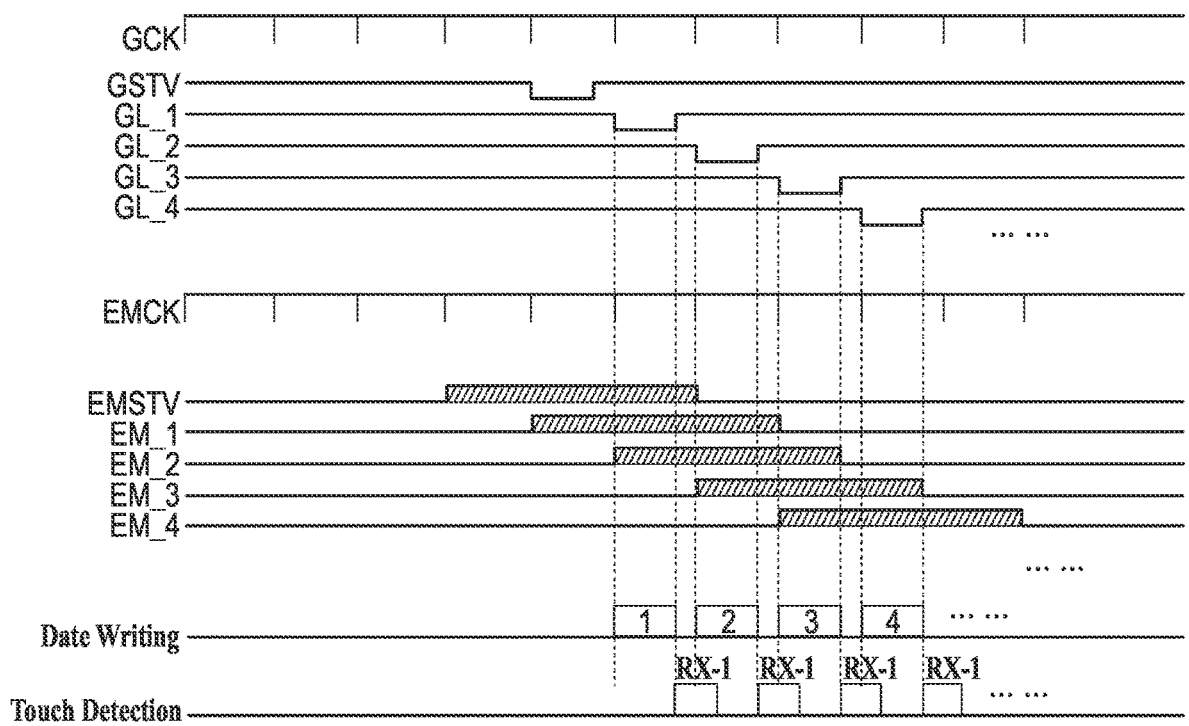
Figure 9:
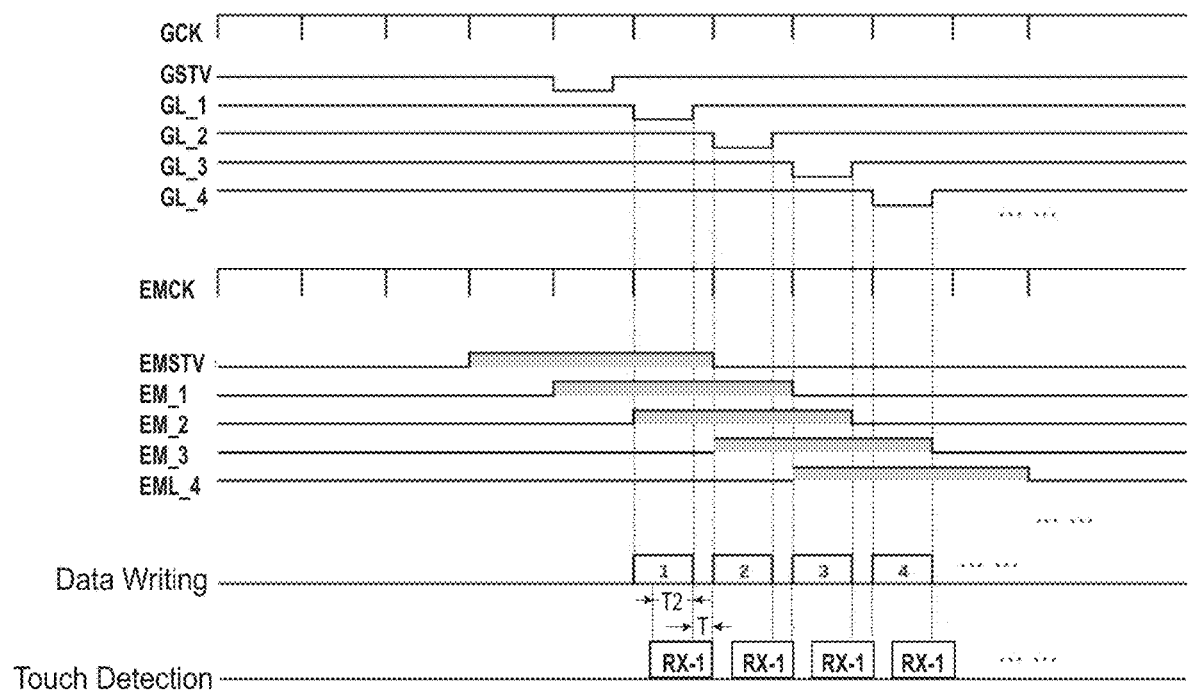
Figure 10:
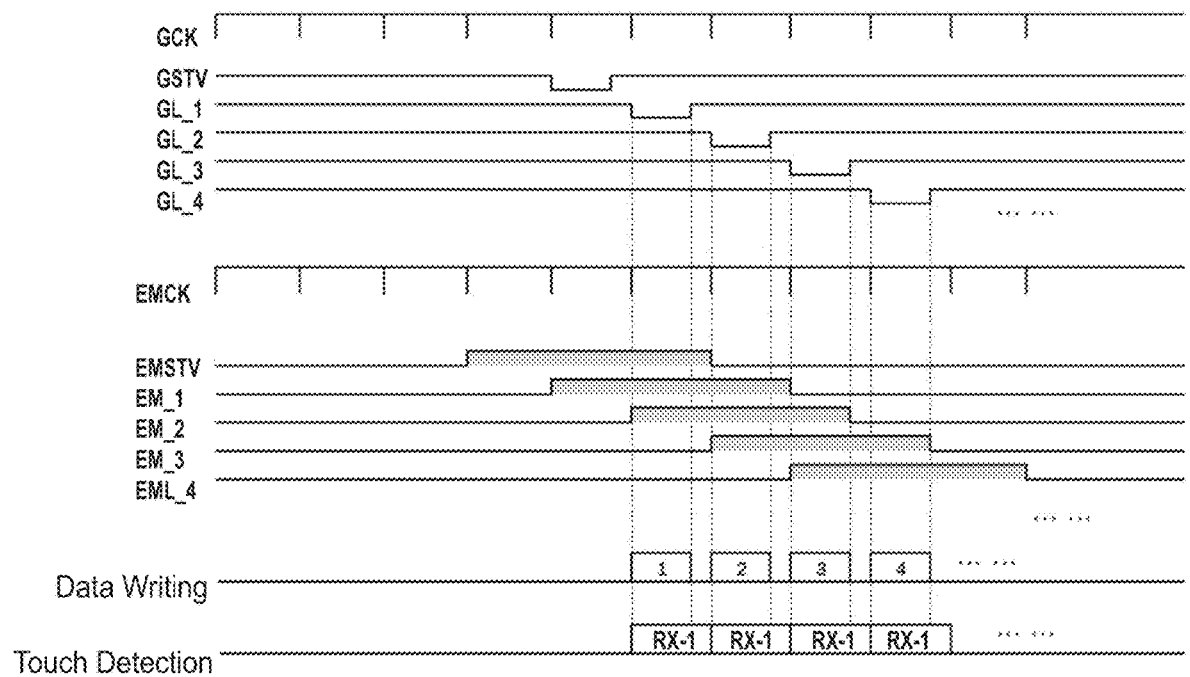

Optionally, the gate driving signal and the light-emission control signal for each row of pixels should satisfy the following timing relationship: the light-emission control signal is of inactive level when the gate driving signal is at an active level, and after the gate driving signal becomes inactive level, the light-emission control signal becomes active level, so that the row of pixels can emit light based on newly written display data. For example, in FIG. 7 to be described later, EM_1 maintains at inactive level (high level) during the period when GLi is of active level, and after EM_1 becomes active level, the first row of pixels can emit light based on the first piece of display data.

In addition, when the working process of the circuit of each pixel unit (e.g., the circuit of the pixel unit shown in FIG. 2A) further includes a reset stage, for each row of pixels, the light-emission control signal should maintain inactive level during the reset stage of the circuit of the pixel unit, so that the pulse width of the inactive level pulse of each light-emission control signal should be at least greater than 2 clock cycles, so as to avoid light-emission during the reset stage and compensation stage of the corresponding circuit of the pixel unit.

Because the light-emission control signals are used to control whether each row of pixels emit light or not, and the light-emission control signal applied to each row of pixels is sequentially shifted and generated, the attributes of respective light-emission control signals are the same for each display frame, that is, the time lengths of inactive pulses of all light-emission control signals are equal, so the time lengths of display light-emission periods of all rows of pixels are equal, thereby making the display luminance of the display panel uniform, so as to improve the display quality.

It should be noted that although the steps described in FIG. 6 are shown in a sequential manner, it does not mean that they must be executed in the order shown, and they can be executed in any suitable other order or in intersection, which is not limited by this disclosure, as long as the goal that the driving method aims to achieve can be achieved. For example, for the first row of pixels, a light-emission control signal with an inactive level pulse can be generated in step S470 and applied to the light-emission control line corresponding to the first row of pixels in step S480, then a gate driving signal with an active level pulse can be generated in step S440 and applied to the gate driving line corresponding to the first row of pixels in step S430, so that data can be written to the pixels in step S430. After the data is written, in step S490, the first row of pixels are controlled to emit light by the light emission signal. For other rows of pixels, similar processes are performed, except that the light emission control signal and gate drive signal for each row of pixels are generated by respective shifts of the light emission control signal and gate drive signal for the previous row of pixels, and are applied to corresponding gate driving line and light emission control line.

FIGS. 7-10 show schematic timing diagrams of setting a touch detection period in the case of including a light-emission control signal according to an embodiment of the present disclosure. Compared with FIGS. 4B-4E, only EM signals are added in the figures, and other details are the same, so the description will not be repeated here.

According to another aspect of the disclosure, a driving circuit is also disclosed, which can be used in a display panel in an OLED touch-and-display device. The driving circuit may include various drivers, such as the gate driver, the source driver and the light-emission control driver described above with reference to FIG. 1, and the driving circuit may also have a certain calculation processing function.

The driving circuit is designed to realize the method as described with reference to FIGS. 4A-10, so that the display and touch detection can be driven in a time-division manner, therefore, the touch detection operation is as less affected by the change in the voltage associated with the display data when the display driving is performed as possible, and by extending the time of each touch detection operation as much as possible, the real-time and accuracy of touch detection results are higher, and the touch detection period can be set only for a part of the display driving periods, thus reducing the possibility of mutual influence between touch detection and display driving, and further improving the accuracy of touch detection. In addition, the light-emission time length of each row of pixels is not affected, the average display luminance values of the plurality of rows of pixels can be approximately the same, thereby making the display luminance of the display panel uniform, so as to improve the display quality.

According to another aspect of the disclosure, an OLED touch-and-display device is also disclosed. The OLED touch-and-display device may have substantially the same arrangement as that described with reference to FIG. 1. For example, an OLED touch-and-display device according to an embodiment of the present disclosure may include: a display panel including a plurality of rows of pixels and a plurality of gate driving lines (GL) in one-to-one correspondence, or including a plurality of rows of pixels, a plurality of gate driving lines (GL), and a plurality of light-emission control lines (EM) in one-to-one correspondence; a touch sensitive layer including a plurality of touch sensitive cells thereon; and a driving circuit, wherein the driving circuit can include various drivers, such as the gate driver, the source driver and the light-emission control driver described with reference to FIG. 1, and the driving circuit should also have a certain calculation processing function. That is, the driving circuit is designed to realize the method as described with reference to FIGS. 4A-10, so that the display and touch detection can be driven in a time-division manner, therefore, the touch detection operation is as less affected by the change in the voltage associated with the display data when the display driving is performed as possible, and by extending the time of each touch detection operation as much as possible, the real-time and accuracy of touch detection results are higher, and the touch detection period can be set only for a part of the display driving periods, thus reducing the possibility of mutual influence between touch detection and display driving, and further improving the accuracy of touch detection. In addition, the light-emission time length of each row of pixels is not affected, the average display luminance values of the plurality of rows of pixels can be approximately the same, thereby making the display luminance of the display panel uniform, so as to improve the display quality.

In addition, in the driving circuit and OLED touch-and-display device disclosed in the embodiment of the present disclosure, touch detection and display time-sharing driving can be realized, so that there is no noise interference from display driving during touch detection operation, so that touch detection does not take a long time, thus saving power. At the same time, under time-sharing driving, the selection of the frequency of the driving signal for touch detection does not need to consider the timing and frequency of each signal related to display driving, so there are more selectable frequencies to counter other noise sources. In addition, the average display brightness of pixels in each row can be approximately the same, so that the display quality of the display panel can be uniform.

Although the present invention has been disclosed by way of examples, it is not intended to limit the present invention. Anyone with general knowledge in the technical field can make some changes and refinements without departing from the spirit and scope of the present invention. Therefore, the scope of protection of the present invention shall be determined as defined by the appended claims.

What is claimed is:

1. A driving method for an OLED touch-and-display device comprises a display panel, wherein the display panel comprises a plurality of rows of pixels and a plurality of gate driving lines (GL) in one-to-one correspondence, and the driving method comprises the following steps:
    generating gate driving signals that are sequentially shifted according to a clock cycle of a clock signal (GCK), based on the clock signal, wherein each of the gate driving signals comprises an active pulse having a pulse width smaller than the clock cycle of the clock signal;
    sequentially applying the gate driving signals to the plurality of gate driving lines;
    for each row of pixels, writing display data in a display driving period for the row of pixels, wherein the display driving period is arranged in a period of the active pulse of a gate driving signal applied to a gate driving line corresponding to the row of pixels; and
    setting a touch detection period for touch detection between two adjacent display driving periods respectively corresponding to two adjacent rows of pixels among the plurality of rows of pixels.

2. The driving method according to claim 1, wherein the touch detection period is set without overlapping with the two adjacent display driving periods.

3. The driving method according to claim 1, wherein the touch detection period overlaps with at least a part of one of the two adjacent display driving periods.

4. The driving method according to claim 3, wherein the touch detection period overlaps with an entire period of one of the two adjacent display driving periods.

5. The driving method according to claim 1, wherein a time length of the display driving period for each row of pixels is substantially equal to the pulse width of the active pulse of the gate driving signal applied to the gate driving line corresponding to the row of pixels.

6. The driving method according to claim 1, wherein each display driving period corresponds to one touch detection period, and the one touch detection period is set between any two adjacent display driving periods.

7. The driving method according to claim 1, wherein one touch detection period corresponds to a group which comprise at least two display driving periods, and the one touch detection period is set between a last display driving period in a former group and a first display driving period in a latter group adjacent to the former group.

8. A driving circuit for a display panel in an OLED touch-and-display device, the display panel including a plurality of rows of pixels and a plurality of gate driving lines (GL) in one-to-one correspondence, or including a plurality of rows of pixels, a plurality of gate driving lines (GL), and a plurality of light-emission control lines (EM) in one-to-one correspondence, the driving circuit being designed to execute the method according to claim 1.

9. An OLED touch-and-display device comprises:
- a display panel including a plurality of rows of pixels and a plurality of gate driving lines (GL) in one-to-one correspondence, or including a plurality of rows of pixels, a plurality of gate drive lines (GL), and a plurality of light-emission control lines (EM) corresponding to one another;
- a touch sensitive layer and a touch controller; and
- the driving circuit according to claim 8, which is used for driving the display panel.

10. A driving method for an OLED touch-and-display device comprises a display panel, wherein the display panel comprises a plurality of rows of pixels and a plurality of gate driving lines (GL) in one-to-one correspondence, and the driving method comprises the following steps:
- generating gate driving signals that are sequentially shifted according to a clock cycle of a clock signal (GCK), based on the clock signal, wherein each of the gate driving signals comprises an active pulse having a pulse width smaller than the clock cycle of the clock signal;
- sequentially applying the gate driving signals to the plurality of gate driving lines;
- for each row of pixels, writing display data in a display driving period for the row of pixels, wherein the display driving period is arranged in a period of the active pulse of a gate driving signal applied to a gate driving line corresponding to the row of pixels; and
- setting a touch detection period for touch detection in a gap interval of active pulses of two adjacent gate driving signals respectively corresponding to two adjacent rows of pixels among the plurality of rows of pixels.

11. The driving method according to claim 10, wherein the touch detection period is extended to overlap with at least a part of one of the active pulses of the two adjacent gate driving signals.

12. The driving method according to claim 11, wherein the touch detection period is extended to overlap with an entire period of one of the active pulses of the two adjacent gate driving signals.

13. The driving method according to claim 10, wherein a time length of the display driving period for each row of pixels is substantially equal to an entire period of the active pulse of the gate driving signal applied to the gate driving line corresponding to the row of pixels.

14. The driving method according to claim 10, wherein each display driving period corresponds to one touch detection period, and the one touch detection period is set in a gap interval of active pulses of any two adjacent gate driving signals.

15. The driving method according to claim 10, wherein one touch detection period corresponds to a group which comprise at least two display driving periods, and
- the one touch detection period is set in a gap interval of active pulses of two adjacent gate driving signals, wherein, a last display driving period of a former group is arranged in a period of one of the active pulses of two adjacent gate driving signals, and a first display driving period of a latter group adjacent to the former group is arranged in a period of the other one of the active pulses of two adjacent gate driving signals.

16. A driving circuit for a display panel in an OLED touch-and-display device, the display panel including a plurality of rows of pixels and a plurality of gate driving lines (GL) in one-to-one correspondence, or including a plurality of rows of pixels, a plurality of gate driving lines (GL), and a plurality of light-emission control lines (EM) in one-to-one correspondence, the driving circuit being designed to execute the method according to claim 10.

17. A driving method for an OLED touch-and-display device comprises a display panel, wherein the display panel comprises a plurality of rows of pixels and a plurality of gate driving lines (GL) in one-to-one correspondence, and the driving method comprises the following steps:
- generating gate driving signals that are sequentially shifted according to a clock cycle of a clock signal (GCK), based on the clock signal, wherein each of the gate driving signals comprises an active pulse having a pulse width smaller than the clock cycle of the clock signal;
- sequentially applying the gate driving signals to the plurality of gate driving lines; and
- for each row of pixels, writing display data in a display driving period for the row of pixels, wherein a time length of each display driving period is shortened with respect to the clock cycle of the clock signal, to allow a touch detection period for touch detection to be set.

* * * * *